United States Patent
Kumar et al.

(10) Patent No.: US 11,349,495 B2
(45) Date of Patent: May 31, 2022

(54) RECOVERING FROM HARD DECODING ERRORS BY REMAPPING LOG LIKELIHOOD RATIO VALUES READ FROM NAND MEMORY CELLS

(71) Applicant: Seagate Technology LLC, Cupertino, CA (US)

(72) Inventors: Naveen Kumar, San Jose, CA (US); Shuhei Tanakamaru, San Jose, CA (US); Erich Franz Haratsch, San Jose, CA (US)

(73) Assignee: Seagate Technology LLC, Fremont, CA (US)

( * ) Notice: Subject to any disclaimer, the term of this patent is extended or adjusted under 35 U.S.C. 154(b) by 0 days.

(21) Appl. No.: 16/849,491

(22) Filed: Apr. 15, 2020

(65) Prior Publication Data

US 2021/0328597 A1 Oct. 21, 2021

(51) Int. Cl.
*H03M 13/01* (2006.01)
*H03M 13/39* (2006.01)
*H03M 13/11* (2006.01)

(52) U.S. Cl.
CPC ..... *H03M 13/015* (2013.01); *H03M 13/1105* (2013.01); *H03M 13/1177* (2013.01); *H03M 13/3927* (2013.01)

(58) Field of Classification Search
None
See application file for complete search history.

(56) References Cited

U.S. PATENT DOCUMENTS

| | | | |
|---|---|---|---|
| 9,397,701 B1 | 7/2016 | Micheloni et al. | |
| 10,326,473 B2 | 6/2019 | Bhatia et al. | |
| 2010/0017684 A1* | 1/2010 | Yang | G11C 11/5642 714/773 |
| 2011/0225350 A1* | 9/2011 | Burger, Jr. | G06F 11/1012 711/103 |
| 2012/0317460 A1* | 12/2012 | Chilappagari | G11C 29/52 714/773 |
| 2014/0040704 A1* | 2/2014 | Wu | G06F 11/1068 714/773 |
| 2014/0129898 A1* | 5/2014 | Letunovskiy | H03M 13/116 714/755 |
| 2017/0177236 A1* | 6/2017 | Haratsch | G06F 11/1072 |
| 2019/0044538 A1 | 2/2019 | Palangappa et al. | |

* cited by examiner

*Primary Examiner* — Guerrier Merant
(74) *Attorney, Agent, or Firm* — Mueting Raasch Group

(57) ABSTRACT

Hard errors are determined for an unsuccessful decoding of codeword bits read from NAND memory cells via a read channel and input to a low-density parity check (LDPC) decoder. A bit error rate (BER) for the hard errors is estimated and BER for the read channel is estimated. Hard error regions are found using a single level cell (SLC) reading of the NAND memory cells. A log likelihood ratio (LLR) mapping of the codeword bits input to the LDPC decoder is changed based on the hard error regions, the hard error BER, and/or the read channel BER.

11 Claims, 4 Drawing Sheets

| | Er | L1 | L2 | L3 | L4 | L5 | L6 | L7 |
|---|---|---|---|---|---|---|---|---|
| Er | 17204 | 344 | 210 | 154 | 168 | 89 | 119 | 15 |
| L1 | 12 | 17539 | 213 | 140 | 117 | 116 | 129 | 17 |
| L2 | 0 | 13 | 17701 | 188 | 156 | 137 | 121 | 12 |
| L3 | 0 | 0 | 10 | 17982 | 183 | 118 | 119 | 11 |
| L4 | 0 | 0 | 0 | 27 | 17943 | 128 | 123 | 15 |
| L5 | 0 | 0 | 0 | 0 | 80 | 18063 | 179 | 14 |
| L6 | 0 | 0 | 0 | 0 | 0 | 36 | 18284 | 50 |
| L7 | 0 | 0 | 0 | 0 | 0 | 0 | 44 | 18365 |

RECOVERING FROM HARD DECODING ERRORS BY REMAPPING LOG LIKELIHOOD RATIO VALUES READ FROM NAND MEMORY CELLS

SUMMARY

The present disclosure is directed to recovering from hard decoding errors by removing log likelihood values read from NAND memory cells. In one embodiment, hard errors are determined for an unsuccessful decoding of codeword bits read from NAND memory cells via a read channel and input to a low-density parity check (LDPC) decoder. A bit error rate (BER) for the hard errors may be estimated and BER for the read channel may be estimated. Hard error regions may be found using a single level cell (SLC) reading of the NAND memory cells. A log likelihood ratio (LLR) mapping of the codeword bits input to the LDPC decoder to decode the codeword bits is changed based on the hard error regions, the BER for the hard errors, and/or the BER for the read channel.

In another embodiment, hard errors are determined for an unsuccessful decoding of codeword bits read from the NAND memory cells via an LDPC decoder. The NAND memory cells are more likely to exhibit higher voltage thresholds upon being read back than the originally programmed voltage thresholds such that a BER of first hard errors for bits flipped from a '1' to a '0' are different than a number of second BER for bits flipped from a '0' to a '1'. Hard error regions are found using an SLC reading of the NAND memory cells in response to determining the hard errors. An LLR mapping of the codeword bits input to the LDPC decoder is changed based on the hard error regions.

These and other features and aspects of various embodiments may be understood in view of the following detailed discussion and accompanying drawings.

BRIEF DESCRIPTION OF THE DRAWINGS

The discussion below makes reference to the following figures, wherein the same reference number may be used to identify the similar/same component in multiple figures.

DETAILED DESCRIPTION

The present disclosure generally relates to solid-state, non-volatile (NV) memory devices. Since the early days of computing, NV data storage was dominated by magnetic storage media, e.g., tape, disk. While magnetic storage is still widely used, the availability of faster solid-state memory, e.g., NAND flash memory, has seen wider adoption in traditional computing devices, e.g., workstations, servers, laptops. While cost per unit storage of flash memory is higher than that of magnetic storage, there are benefits (e.g., speed, reduced size) that make the higher cost worth it to consumers. Further, solid-state NV is ideal for mobile devices due to, among other things, its small size, low power consumption, and resistance to shock and vibration.

While solid-state NV devices do not have mechanical drive components that wear out, the NAND data storage cells do degrade over time, e.g., in response to repeated use, elevated temperatures, etc. This degradation can also be considered as wear, in that it tends to get worse through the life of the storage device. One way that wear exhibits itself is in an increase in hard errors, in which a bit that was written as a 1 or 0 is read back as 0 or 1, respectively. Hard errors can also be caused by defects in the media with little or no dependence on wear, in which case such hard errors may occur also in the beginning or middle of life.

Hard errors are sporadically observed from the NAND device, in particular around end of life program erase (PE) cycles. It has been observed that certain hard errors are asymmetric in nature, such that the probability of hard error happening from the bit flip being 1→0 is not equal to the probability of hard error happening from the bit flip being 0→1. In this disclosure, a scheme is described to detect the presence of asymmetric hard errors, and a technique to find an optimal LLR mapping based on XSB information that can improve the correction capability of the LDPC decoder significantly. The XSB information refers to the location within the bits read from the cell, e.g., least significant bit (LSB), center significant bit (CSB), and most significant bit (MSB). The proposed technique is effective in correcting hard errors present in the data.

Figure 1:
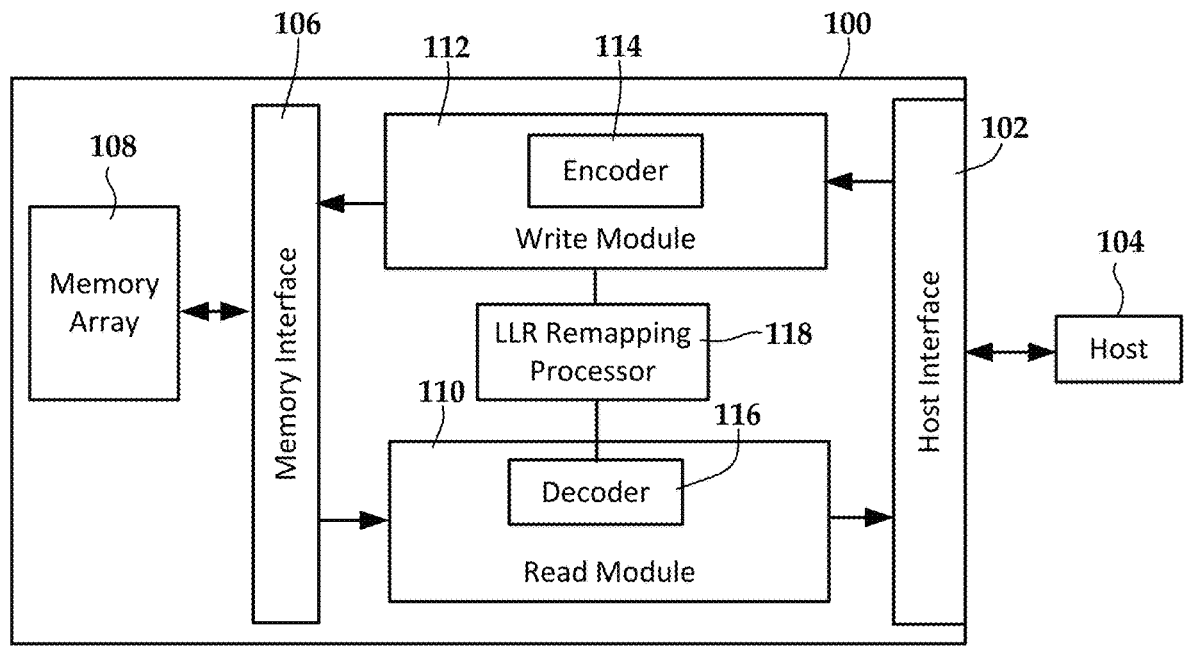
FIG. 1 is a block diagram of an apparatus according to an example embodiment.

In FIG. 1, a block diagram illustrates an NV memory storage device 100 according to an example embodiment. A host interface 102 facilitates the transfer of data and control signals between the storage device 100 and a host 104. Similarly, a memory interface 106 facilitates transfer of data and control signals between read and write modules 110, 112 and a memory array 108. The memory array 108 includes at least NAND flash memory, such as 2D NAND flash or 3D NAND flash (also called vertical NAND, or V-NAND). The write module 106 controls write operations involving transfer of data from the host 104 through the storage device 100 and then to the memory 108 for storage. Prior to storage of the data in memory 108, the data may be encoded by encoder circuitry 114 using an error correcting code (ECC). The encoded data is then transferred via the memory interface 106 from the storage device 100 to the memory 108 and is programmed into the memory cells of the memory 108.

The read module 110 controls certain read operations involving the transfer of data from the memory 108 through the storage device 100 and then to the host 104. For example, if the host 104 requests retrieval of the stored data in the memory 108, the encoded data is read from the memory 108 and is decoded by decoder circuitry 116 using the ECC. The decoded data is transferred to the host 104 via the host interface 102. The decoder 116 uses the ECC to attempt to identify and/or correct errors that are present in the data read from the memory 108. The data errors may arise, for example, due to data corruption caused by charge leakage, disturb effects and/or hard errors as mentioned above. As will be described in greater detail below, a log-likelihood ratio (LLR) mapping processor 118 can be used to improve performance of the decoder 116.

Generally, the components of the modules 110, 112 and processor 118 can be implemented using a combination of custom logic circuitry and general-purpose processors. The device 100 will include one or more processors coupled to memory and co-processing circuitry, sometimes referred to as a system-on-a-chip (SoC). The methods described herein can be implemented as custom circuitry and instructions (e.g., firmware, software) configured to cause a processor to perfume the method.

Figure 2:
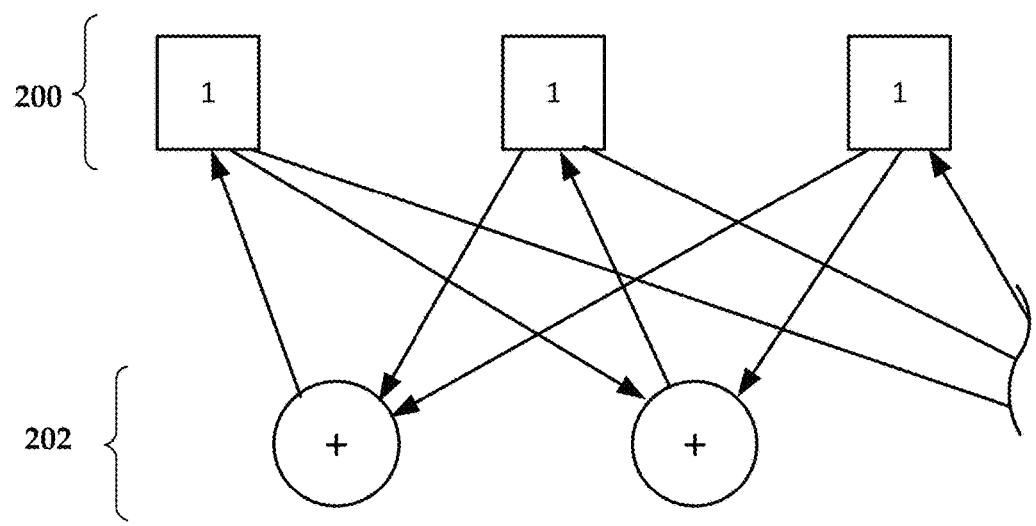
FIG. 2 is a block diagram of showing a decoder according to an example embodiment.

The decoder 116 in this example uses low-density parity check (LDPC) codes to correct errors in the data. An LDPC code is often represented as a graph, as shown by way of example in FIG. 2. The top nodes 200 are referred to as variable nodes and are shown here with the bits that are part of a valid message. The bottom nodes 202 are constraint nodes and enforce a constraint on the variable nodes, e.g., that the sum of the inputs to the nodes 202 equals zero, modulo two. The message is encoded with redundant data (parity bits) and the message can be decoded by iteratively updating the variable and constraint nodes 200, 202.

Low-density parity check codes are prevalently used to correct errors obtained in the read back data from the NAND device. A single read from the NAND provides the hard information for the data. In order to obtain the soft information, multiple reads are issued to the NAND data storage device which are further used to generate soft information, which is expressed as a log-likelihood ratio (LLR). If any bit in the read back data is in error, the reliability of that error bit is likely to be smaller in magnitude. In modern LDPC decoders, any error with a low reliability will have significantly higher probability of getting corrected, during the decoding, than any error with a high reliability.

The reliability of any bit is indicated by the LLR that is assigned by the read circuitry after conducting multiple reads. An error with a large magnitude LLR is called a hard error, and hard error is detrimental to the LDPC decoder performance. Hard errors are sporadically observed from the NAND device, in particular around end of life program erase (PE) cycles. Furthermore, these hard errors are asymmetric in nature, the probability of hard error happening from the bit flip being 1->0 is not equal to the probability of hard error happening from the bit flip being 0->1.

Methods and apparatuses described herein are configured to detect the presence of asymmetric hard errors, and devise a technique to find an optimal LLR mapping based on XSB information that can improve the correction capability of the LDPC decoder significantly. In this disclosure, the following notation is used. Let $L_1^N = [L_1, L_2 \ldots L_N]$ denote the soft information obtained from the channel for an LDPC codeword of length N, where $L_i \in [-2^R+1, 2^R+1]$, the soft information has R+1 bit information obtained from the channel. Let $b_1^N = [b_1, b_2 \ldots b_N]$ denote the received hard information LDPC codeword, where $$b_i = \begin{cases} 1, & \text{if } L_i \geq 0 \\ 0, & \text{if } L_i < 0 \end{cases}$$

Further, let $\hat{b}_1^N = [\hat{b}_1, \hat{b}_2 \ldots \hat{b}_N]$ denote the decoded LDPC codeword after the LDPC decoding. Let $\mathcal{F}: [-2^R+1, 2^R+1] \to [-2^R-1, 2^R+1]$ denote the functional mapping space which contains all possible valid mappings for LLR. The indicator function is defined as, $$1_{x \in A} = \begin{cases} 1, & \text{if } x \in A \\ 0, & \text{if } x \notin A \end{cases}$$

In certain drive failures, it has been observed that cells are moving to a higher level after programing. This can be seen in the table of FIG. 3. As seen in this table, eight levels (Er, L1, L2 to L7) are programmed in a cell of the word line in the NAND, and cells are read back from the NAND cells. The diagonal entries represent the number of cells programmed to that level, and non-diagonal entry in a row represents how many cells are shifted after programming in that row. As indicated by the table entries above the diagonal that are outlined in thickerlines, the cells are moving towards higher levels once programmed and cause hard errors. The cells, moving to voltage threshold lower level from the programmed threshold level (below the diagonal), are due to media noise or the retention effect. As this table illustrates, the likelihood of the threshold voltage of the cells moving higher than what was programmed is significantly higher than the likelihood that the threshold voltage of the cells move lower. This phenomenon causes hard errors that are detrimental to the LDPC decoder performance.

The first step in the proposed recovery process is to estimate the bit error rate (BER) due to hard errors which are present and are of asymmetric nature. Let $b_1^N$ and $\hat{b}_1^N$ denote the received hard information for the LDPC codeword from the channel and the hard information after the LDPC decoding respectively. The hard error bits, having maximum LLR, will be flipped by the LDPC decoder more compared to a case when there are no hard errors present in the data. The hard bit flipped for bit '0' ($HBF_0$) after the LDPC decoding is given as in Equation (1) below. The hard bit flipped for bit '1' ($HBF_1$) after the LDPC decoding is given as in Equation (2).

$$HBF_0 = \Sigma_{i=1}^{N} 1_{b_i \oplus \hat{b}_i = 1} 1_{L_i = -2^R+1} \tag{1}$$

$$HBF_1 = \Sigma_{i=1}^{N} 1_{b_i \oplus \hat{b}_i = 1} 1_{L_i = 2^R-1} \tag{2}$$

A look up table can be generated by performing offline simulations with the LDPC decoder, which can be used to estimate the BER due to the hard errors. The lookup table for estimating BER for bit '0' will have a tuple like $\{BER_{HE0}^i, \alpha_i\}_{i=1}^L$, where $BER_{HE0}^i$ will be outputted if $\alpha_{i-1} < HBF_0 \leq \alpha_i$ and the values of $\alpha_i$ are obtained through the offline simulations. Similarly, the lookup table for estimating BER for the bit '1' will have a tuple like $\{BER_{HE1}^j, \alpha_j\}_{j=1}^L$ will be outputted if $\beta_{j-1} < HBF_i \leq \beta_j$ and the values of $\beta_j$ are obtained through the offline simulations.

An LLR mapping based on the estimation of the hard errors BERs may further require the knowledge of the BER of the channel as well. A lookup table can be generated using unsatisfied check information (USC) of the LDPC decoder. The lookup table for estimating the BER for the channel will have a tuple like $\{BER_{CH}^k, \gamma_k\}_{k=1}^L$ where $BER_{CH}^k$ will be outputted if $\gamma_k - 1 < USC \leq \gamma_k$ and the values of $\gamma_k$ are obtained through the offline simulations. It should be noted that the independence among BER of hard errors for bit '0'/'1' and BER of the channel is assumed. In this case, the dimensionality of look tables is reduced to 3 L instead of $L^3$, by assuming independence among BERs. The assumption is pragmatic due to the fact that the LDPC decoder doesn't flip correct bits with high magnitude LLRs.

Once the estimation of BERs is done, the second step is to find the optimal LLR mapping which provides the best correction capability using the LDPC decoder. The problem can be analytically formulated as finding the best LLR mapping ($\hat{F}(BER_{HE0}^i, BER_{HE1}^j, BER_{CH}^k)$) which minimizes codeword failure rate (CFR) for the LDPC decoder, as shown in Equation (3), where $\mathcal{F}: [-2^R+1, 2^R+1] \to [-2^R+1, 2R+1]$ is the functional mapping space with all possible valid LLR mappings. This optimal mapping ($\hat{F}(BER_{HE0}^i, BER_{HE1}^j, BER_{CH}^k)$) search can be performed offline, and will be stored as a look up table with the dimensionality $L^3$.

$$\hat{F}(BER_{HE0}{}^i, BER_{HE1}{}^j, BER_{CH}{}^k) = \mathrm{argmin}_{\forall j} CRF_{LDPC}$$
$$(BER_{HE0}{}^i, BER_{HE1}{}^j, BER_{CH}{}^k) \qquad (3)$$

Figures 3, 4:
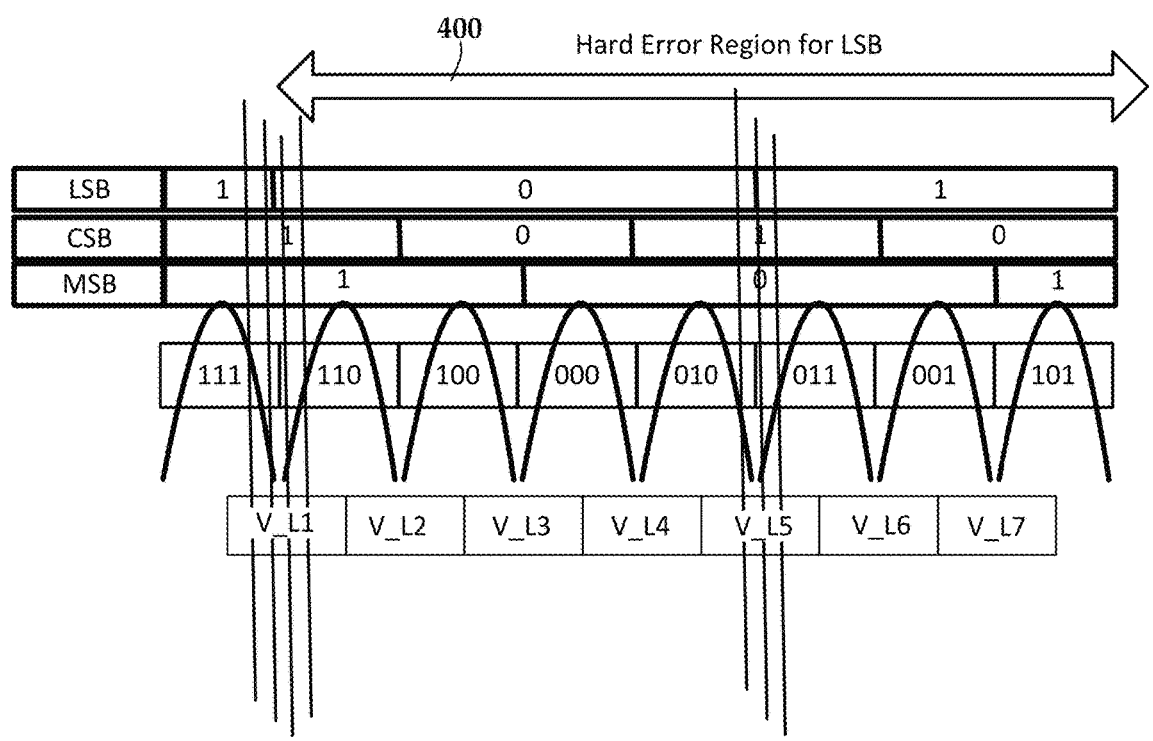
FIG. 3 is a table showing drifting of threshold voltages in tested a memory device according to an example embodiment.
FIGS. 4-6 are block diagrams showing hard error regions for different memory cell bits according to an example embodiment.
Figure 5:
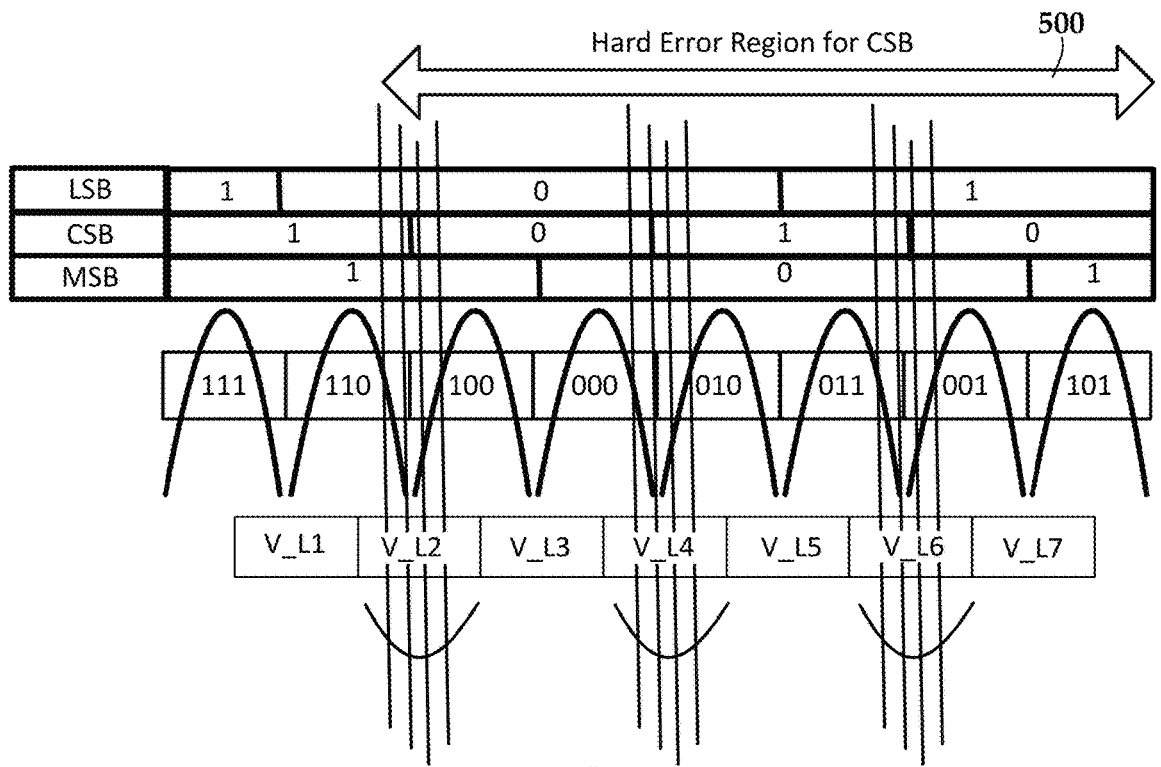
Figure 6:
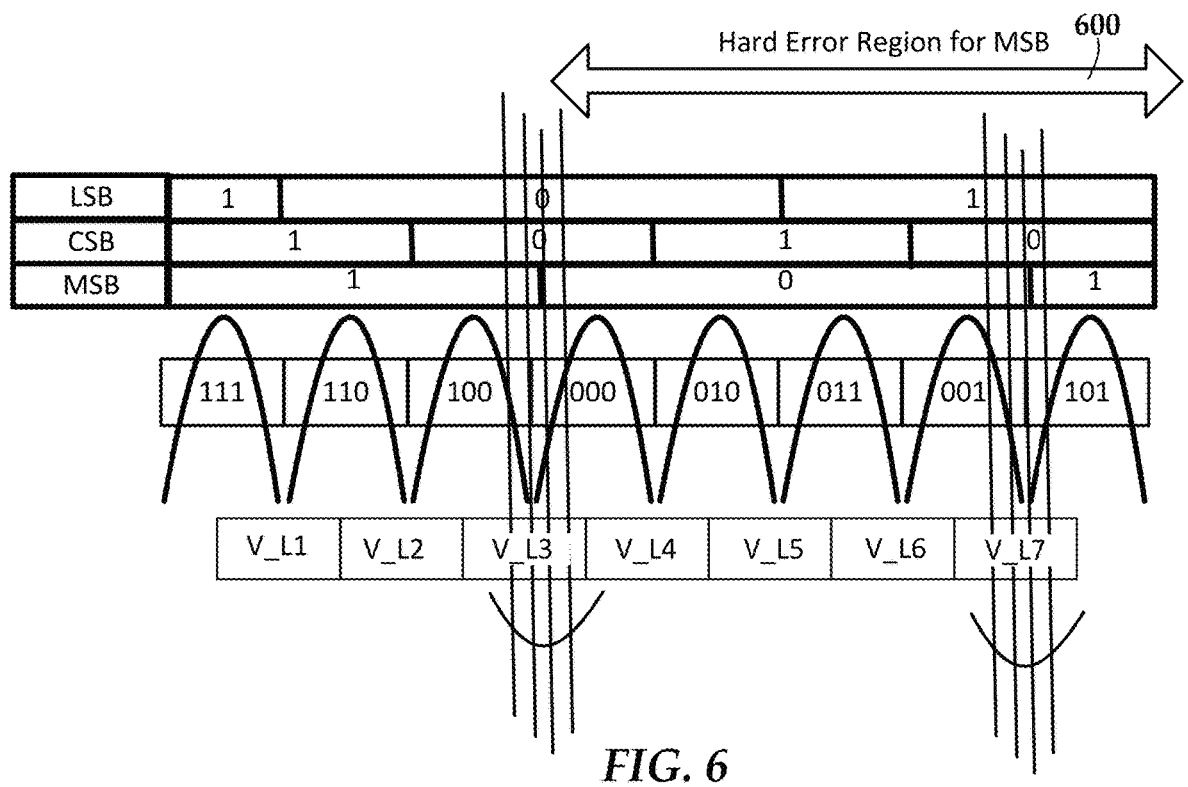

The third step is to apply the optimal mapping to levels which are affected by hard errors. As shown in FIG. 3, cells are typically moving to higher levels. A single-level cell (SLC) read can be issued to identify the region where hard errors are present, which is referred to herein the hard error region. In FIGS. 4-6, diagrams show the hard error regions according to example embodiments. In FIG. 4, an SLC read at voltage threshold L1 for the LSB is shown for a hard error region 400. The hard information obtained from the SLC read can be utilized in masking out the LLR mapping to bits where hard errors don't occur. The optimal LLR mapping ($\hat{F}(BER_{HE0}{}^i$, $BER_{HE1}{}^j$, $BER_{CH}{}^k$)) will be applied only on bits which lie within the hard error region. It can be seen in FIGS. 5 and 6 that CSB and MSB hard error regions 500, 600 are different and involve SLC reads at DAC 2 (L2) and DAC 3 (L3) respectively. Note that these figures are for triple-level cell (TLC) flash memory, however similar concepts may apply for NAND cells with fewer or more levels.

Figure 7:
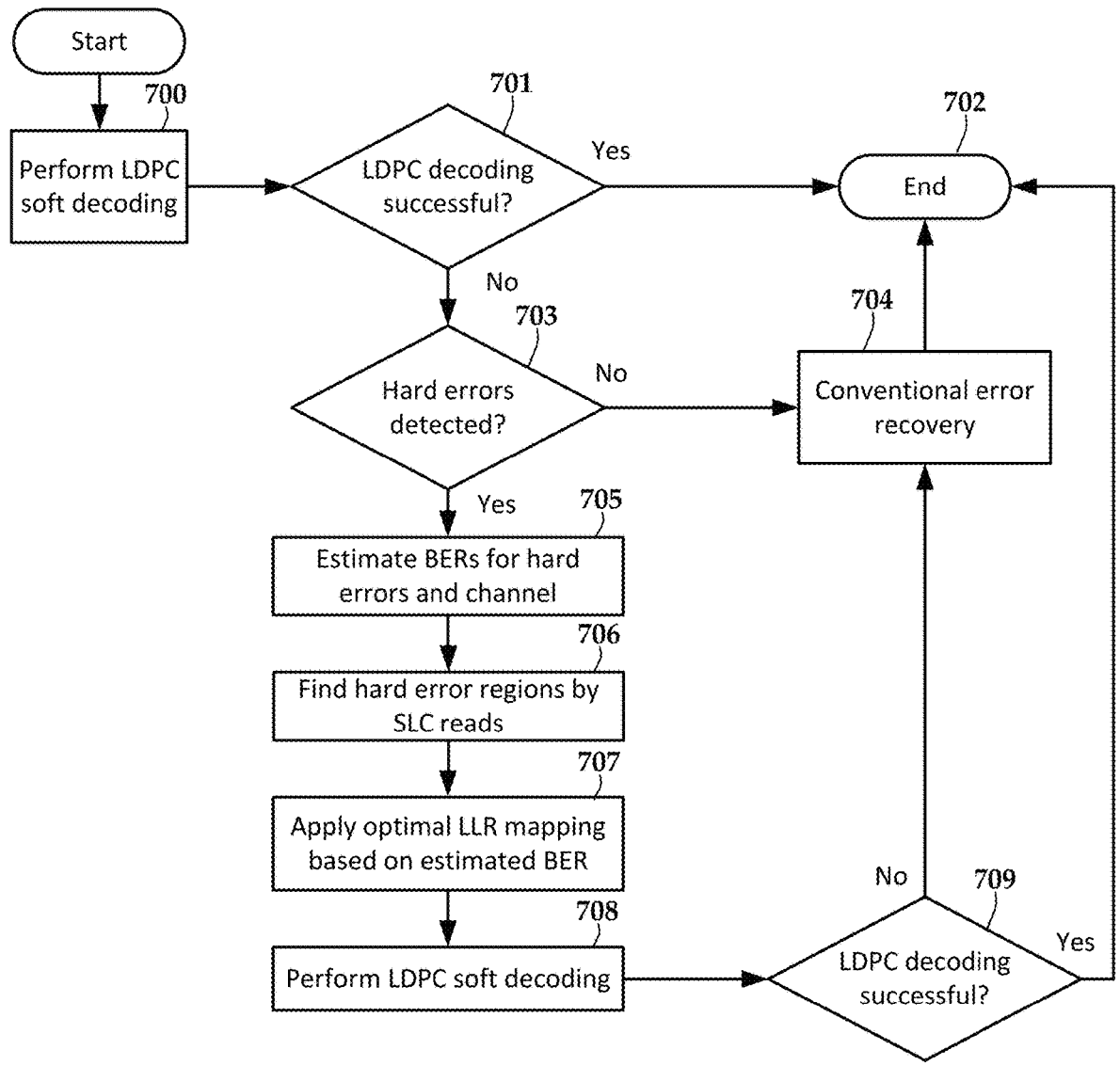
FIG. 7 is a flowchart of a method according to an example embodiment.

In FIG. 7, a flowchart shows a method according to an example embodiment. The method starts with soft decoding 700 of data using an LDPC decoder. If it is determined at block 701 that the decoding is successful, the procedure ends 702. If decoding was not successful (block 701 returns 'no'), a determination is made at block 703 whether hard errors were detected. If hard errors were not detected (block 703 returns 'no'), then conventional error recovery 704 is performed. If hard errors were detected (block 703 returns 'yes'), then BER is estimated 705 for the hard errors and channel. The hard error regions are found 706 through SLC reads. An optimal LLR mapping is applied 707 based on the estimated BER, which is then used as an input to a second attempt as LDPC soft decoding 708. If it is determined at block 709 if this decoding was successful, the procedure ends 702; otherwise conventional error recovery 704 is performed.

Early detection of hard errors and estimation of BERs for hard errors Using the LDPC decoder output, the flipped hard bit information can be calculated and used to detect the presence of hard errors as described in equations 1 and 2 and the adjacent paragraphs. The early detection of the presence of hard errors can reduce the latency of the error recovery. If it is not detected at an early phase of the error recovery, the LDPC decoder likely cannot correct hard errors during soft decoding retries and LLR compensations steps that will take much longer latencies. The BERs for hard errors and the channel can be estimated using closed form expressions for $HBF_0$, $HBF_i$ and USC given above, which indicate asymmetry of the hard errors.

LLR mapping for asymmetric hard errors—The optimal LLR mapping is further found through a look up table that can improve the correction capability for the LDPC decoder as described by equation 3 and the preceding paragraphs. The optimal mapping is contingent upon BERs for the channel and asymmetric hard errors obtained as described above.

SLC reads for applying LLR mapping—Cells movement to higher cells enforces another constraint in terms of applying LLR mapping to cells which belong to the hard error region. The hard error region is identified using an SLC read placed on the corresponding DAC based on XSB.

The advantages of the proposed scheme are twofold. The first is that the early detection significantly reduces the decoder latency and improve the QoS at the tail of the distribution. The second is that the scheme significantly reduces the number of required RAISE or RAID recoveries, due to the enhanced error correction for the LDPC decoder by applying the optimal LLR mapping. The drive level results corroborate the proposed scheme gains over the conventional error recovery flow.

In Table 1 below, the results of this method applied to a storage device are shown. The method was applied on a drive exhibiting the asymmetric hard errors phenomenon. A coarse LLR mapping was defined that minimizes the number of required RAISE or RAID recoveries and reduces the recovery time significantly by avoiding steps of the entire error recovery flow. The proposed scheme involves one soft decoding whereas regular recovery goes through more than 50 soft decoding steps followed by raise recovery. Latency for the recovery is significantly shortened if the optimal LLR mapping leads to a successful LDPC decoding. It should be noted that the performance gains shown in Table 1 were not optimized completely, and can be further optimized in future.

TABLE 1

| Performance Metric | Without the proposed scheme | With the proposed scheme | Performance gain |
| --- | --- | --- | --- |
| Number of raise recoveries | 18,711 | 16,847 | ~10% reduction in raise recoveries |
| Latency | 50+ soft decoding steps plus raise recovery | One soft decoding | Significant latency reduction for cases where LLR mapping provided successful decoding |

The various embodiments described above may be implemented using circuitry, firmware, and/or software modules that interact to provide particular results. One of skill in the arts can readily implement such described functionality, either at a modular level or as a whole, using knowledge generally known in the art. For example, the flowcharts and control diagrams illustrated herein may be used to create computer-readable instructions/code for execution by a processor. Such instructions may be stored on a non-transitory computer-readable medium and transferred to the processor for execution as is known in the art. The structures and procedures shown above are only a representative example of embodiments that can be used to provide the functions described hereinabove.

The foregoing description of the example embodiments has been presented for the purposes of illustration and description. It is not intended to be exhaustive or to limit the embodiments to the precise form disclosed. Many modifications and variations are possible in light of the above teaching. Any or all features of the disclosed embodiments can be applied individually or in any combination are not meant to be limiting, but purely illustrative. It is intended that the scope of the invention be limited not with this detailed description, but rather determined by the claims appended hereto.

What is claimed is:

1. A method comprising:
   determining hard errors for an unsuccessful decoding of codeword bits read from an array of NAND memory cells via a low-density parity check (LDPC) decoder, each of the NAND memory cells storing two or more bits of data;
   finding hard error regions using a single level cell (SLC) reading of the NAND memory cells at a different threshold voltage based on whether a bit of the codeword bits is a least significant bit or a most significant bit; and changing a log likelihood ratio (LLR) mapping of the codeword bits input to the LDPC decoder to decode the codeword bits based on the hard error regions.

2. The method of claim 1, wherein finding the hard error regions comprises reading at the different threshold voltage further based on whether the bit of the codeword bits is a center significant bit.

3. The method of claim 1, wherein the hard errors are due to a threshold voltage of the NAND memory cells being significantly asymmetric due to significantly more of the NAND memory cells exhibiting higher threshold voltages than what was programmed.

4. The method of claim 1, further comprising estimating bit error rate (BER) for the hard errors and estimating BER for a read channel used to read the NAND memory cells.

5. The method of claim 1 wherein the LLR mapping is only changed for bits which are in the hard error regions.

6. A method comprising:
   determining hard errors for an unsuccessful decoding of codeword bits read from an array of NAND memory cells via a low-density parity check (LDPC) decoder, each of the NAND memory cells storing two or more bits of data;
   finding hard error regions using a single level cell (SLC) reading of the NAND memory cells; and
   changing a log likelihood ratio (LLR) mapping of the codeword bits input to the LDPC decoder to decode the codeword bits based on the hard error regions, wherein the LLR mapping is only changed for bits which are in the hard error regions and the LLR mapping comprises minimizing codeword failure rate $CRF_{LDPC}$ ($BER_{HE0}^i$, $BER_{HE1}^j$, $BER_{CH}^k$) for the LDPC decoder, wherein $BER_{HE0}^i$ is a first error rate for a bit value of zero, $BER_{HE1}^j$ is a second error rate for a bit value of one, and $BER_{CH}^k$ is a channel error rate.

7. The method of claim 6, wherein determining the hard errors comprises determining first hard bits flipped for bit values of '1' ($HBF_1$) and second hard bits flipped for bit values of '0'($HEF_0$), wherein $HBF_1 = \Sigma_{i=1}^{N} 1_{b_i \oplus \hat{b}_i = 1} 1_{L_i = 2^R - 1}$ and $HBF_0 = \Sigma_{i=1}^{N} 1_{b_i \oplus \hat{b}_i = 1} 1_{L_i = -2^R + 1}$.

8. A system comprising:
   a plurality of NAND memory cells, each of the NAND memory cells storing two or more bits of data as originally programmed voltage thresholds;
   a read channel coupled to access the array of NAND memory; and
   a processor coupled to the read channel and operable to:
      determine hard errors for an unsuccessful decoding of codeword bits read from the NAND memory cells via a low-density parity check (LDPC) decoder, wherein the NAND memory cells are more likely to exhibit higher voltage thresholds upon being read back than the originally programmed voltage thresholds such that a bit error rate (BER) of first hard errors for bits flipped from a '1' to a '0' are different than a number of second BER for bits flipped from a '0' to a '1';
      find hard error regions using a single level cell (SLC) reading of the NAND memory cells at a different threshold voltage based on whether a bit of the codeword bits is a least significant bit or a most significant bit in response to determining the hard errors; and
      based on the hard error regions, change a log likelihood ratio (LLR) mapping of the codeword bits input to the LDPC decoder.

9. The system of claim 8, wherein the LLR mapping is further changed based on a BER of the channel.

10. The system of claim 8, wherein finding the hard error regions comprises reading at the different threshold voltage further based on whether the bit of the codeword bits is a center significant bit.

11. The system of claim 8, wherein the LLR mapping is only changed for bits which are in the hard error regions.

* * * * *

UNITED STATES PATENT AND TRADEMARK OFFICE
CERTIFICATE OF CORRECTION

PATENT NO. : 11,349,495 B2
APPLICATION NO. : 16/849491
DATED : May 31, 2022
INVENTOR(S) : Kumar et al.

It is certified that error appears in the above-identified patent and that said Letters Patent is hereby corrected as shown below:

In the Claims

Column 7, In Claim 5 Line 19, 'claim 1' should be -- claim 1, --

Column 7, In Claim 6 Line 36, '$BER_{HE0}{}^{i}$' should be -- $BER_{HE0}^{i}$ --.

Column 7, In Claim 6 Line 37, '$BER_{HE1}{}^{j}$' should be -- $BER_{HE1}^{j}$ --.

Column 7, In Claim 6 Line 38, '$BER_{CH}{}^{k}$' should be -- $BER_{CH}^{k}$ --.

Signed and Sealed this
Eighteenth Day of April, 2023

Katherine Kelly Vidal
*Director of the United States Patent and Trademark Office*